(12) United States Patent
Mirzaei et al.

(10) Patent No.: US 8,275,332 B2
(45) Date of Patent: *Sep. 25, 2012

(54) GAIN-CONTROL METHODS OF TRANSMITTER MODULATORS

(75) Inventors: Ahmad Mirzaei, Costa Mesa, CA (US); Alireza Zolfaghari, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/303,066

(22) Filed: Nov. 22, 2011

(65) Prior Publication Data

US 2012/0071119 A1  Mar. 22, 2012

Related U.S. Application Data

(63) Continuation of application No. 11/947,240, filed on Nov. 29, 2007, now Pat. No. 8,081,937.

(51) Int. Cl.
*H04B 1/04* (2006.01)

(52) U.S. Cl. ............... 455/127.2; 455/91; 455/232.1; 455/251.1; 455/293; 327/355

(58) Field of Classification Search ............... 455/127.2, 455/91, 127.1, 115.1, 232.1, 241.1, 246.1, 455/247.1, 248.1, 251.1, 293, 339; 327/113, 327/325, 355, 356, 357

See application file for complete search history.

(56) References Cited

U.S. PATENT DOCUMENTS

| | | | |
|---|---|---|---|
| 5,530,927 A * | 6/1996 | Smith ........................... 455/317 |
| 6,812,771 B1 * | 11/2004 | Behel et al. .................... 327/359 |
| 6,944,437 B2 * | 9/2005 | Yang et al. ..................... 455/323 |
| 7,369,837 B2 | 5/2008 | Kim |
| 7,392,028 B2 | 6/2008 | Goddard |
| 7,433,658 B1 | 10/2008 | Shirvani-Mahdavi et al. |
| 7,450,913 B2 | 11/2008 | Friedrich et al. |
| 7,640,002 B2 | 12/2009 | Kuttner |
| 7,929,938 B2 | 4/2011 | Sellars et al. |
| 7,962,116 B1 | 6/2011 | Tsai et al. |
| 8,081,937 B2 | 12/2011 | Mirzaei et al. |
| 2006/0172718 A1 * | 8/2006 | Leistner et al. ............... 455/323 |
| 2009/0075689 A1 | 3/2009 | Aniruddhan et al. |
| 2009/0085645 A1 * | 4/2009 | Tanaka ......................... 327/407 |
| 2009/0131007 A1 * | 5/2009 | Molnar et al. ................ 455/320 |
| 2009/0225897 A1 | 9/2009 | Toyota et al. |
| 2009/0261887 A1 | 10/2009 | Embabi et al. |
| 2011/0068861 A1 * | 3/2011 | Denison ......................... 330/10 |
| 2011/0092176 A1 * | 4/2011 | Molnar et al. ................ 455/320 |
| 2011/0201286 A1 | 8/2011 | Georgantas et al. |

OTHER PUBLICATIONS

Notice of Allowance received for U.S. Appl. No. 11/947,240, mailed on Sep. 7, 2011, 8 pages.
Response after Notice of Allowance filed for U.S. Appl. No. 11/947,240, filed on Nov. 10, 2011, 9 pages.

* cited by examiner

*Primary Examiner* — Pablo Tran
(74) *Attorney, Agent, or Firm* — Brake Hughes Bellermann LLP

(57) ABSTRACT

An apparatus comprising a plurality of switchable full step mixer unit cells, wherein each switchable full step unit cell is configured to, when the full step transceiver mixer unit cell is turned on, increase the gain experienced by an electronic signal by a full step increment, and wherein the step increment is substantially constant regardless of temperature; and at least one switchable partial step mixer unit cell configured to, when the partial step transceiver mixer unit is turned on, increase the gain experienced by the electronic signal by a predetermined step increment less than that of a full step, and wherein the partial step increment is substantially constant regardless of temperature.

20 Claims, 5 Drawing Sheets

100

200

400 Switchable Partial Step Mixer Unit Cell, In-Phase Portion

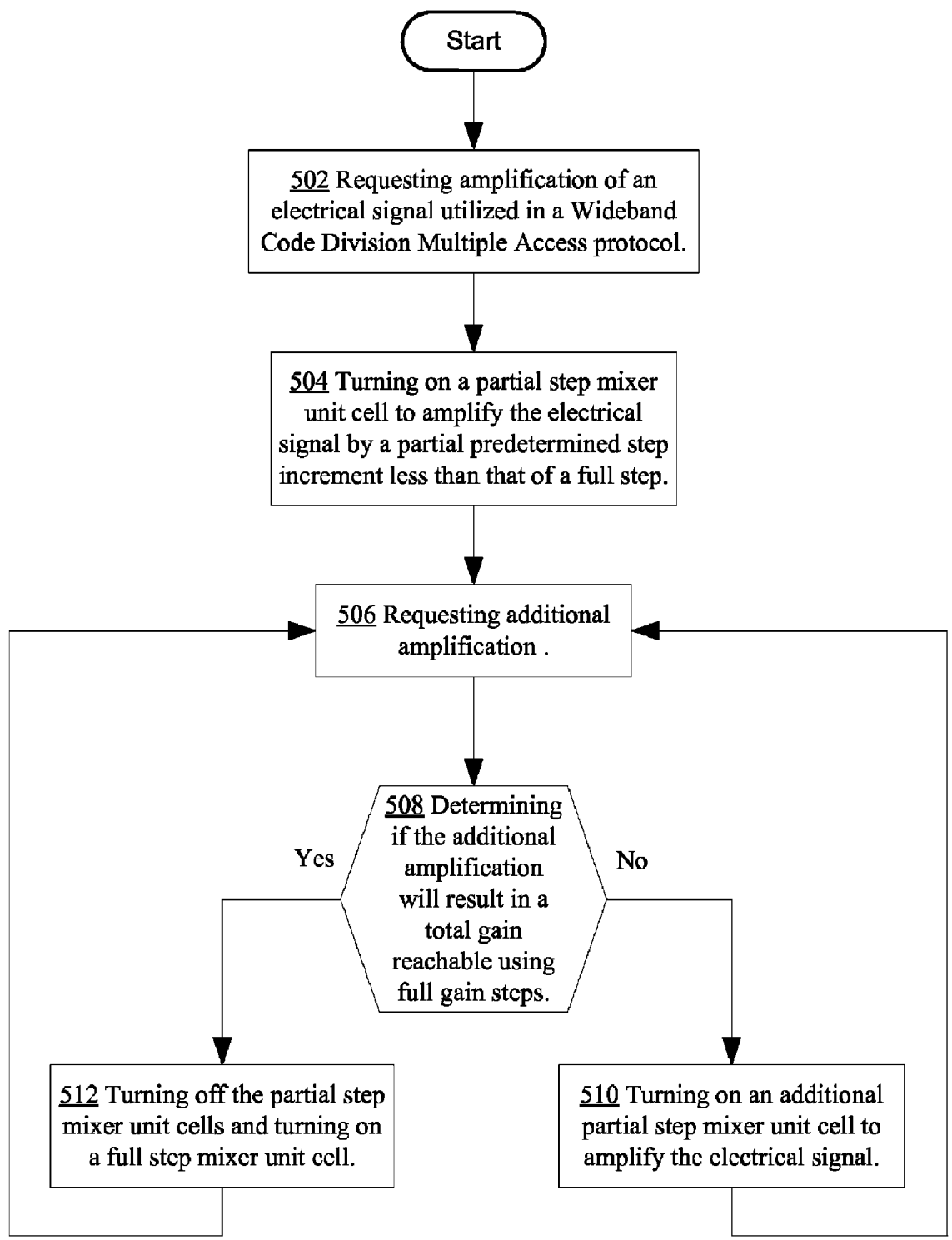

US 8,275,332 B2

GAIN-CONTROL METHODS OF TRANSMITTER MODULATORS

CROSS-REFERENCE TO RELATED APPLICATION

This application is a continuation of, and claims priority under 35 U.S.C. §120 to, application Ser. No. 11/947,240, filed on Nov. 29, 2007, now issued as U.S. Pat. No. 8,081,937, entitled "GAIN-CONTROL METHODS OF TRANSMITTER MODULATORS". The subject matter of these earlier filed applications are hereby incorporated by reference.

TECHNICAL FIELD

This description generally relates to the control of the gain of an electrical signal, and more specifically to the control of the gain of a communication signal utilizing a transformer.

BACKGROUND

Wideband Code Division Multiple Access (WCDMA), in this context, is often a type of third generation (3G) cellular network. More technically, WCDMA is often a wideband spread-spectrum mobile air interface or protocol that utilizes the direct sequence Code Division Multiple Access (CDMA) signaling method to achieve higher speeds and support more users compared to the implementation of time division multiplexing (TDMA) used by second generation (2G) networks. It is understood that WCDMA is merely one non-limiting communication technique to which the disclosed subject matter may be applied.

Often a WCDMA device will include a form of gain control. This may generally allow a user to control the strength of a signal transmitted by the WCDMA device. In a typical WCDMA transmitter some portion of the gain-control is built into a pre-amplification driver and the rest of the gain control is frequently distributed amongst a transceiver mixer and base-band filter. The gain control is frequently divided into discrete chunks, called "gain steps".

SUMMARY

A system and/or method for communicating information, substantially as shown in and/or described in connection with at least one of the figures, as set forth more completely in the claims.

BRIEF DESCRIPTION OF THE DRAWINGS

FIG. 5 is a flowchart of a technique for controlling the gain of an electrical signal in accordance with the disclosed subject matter.

DETAILED DESCRIPTION

Figure 1:
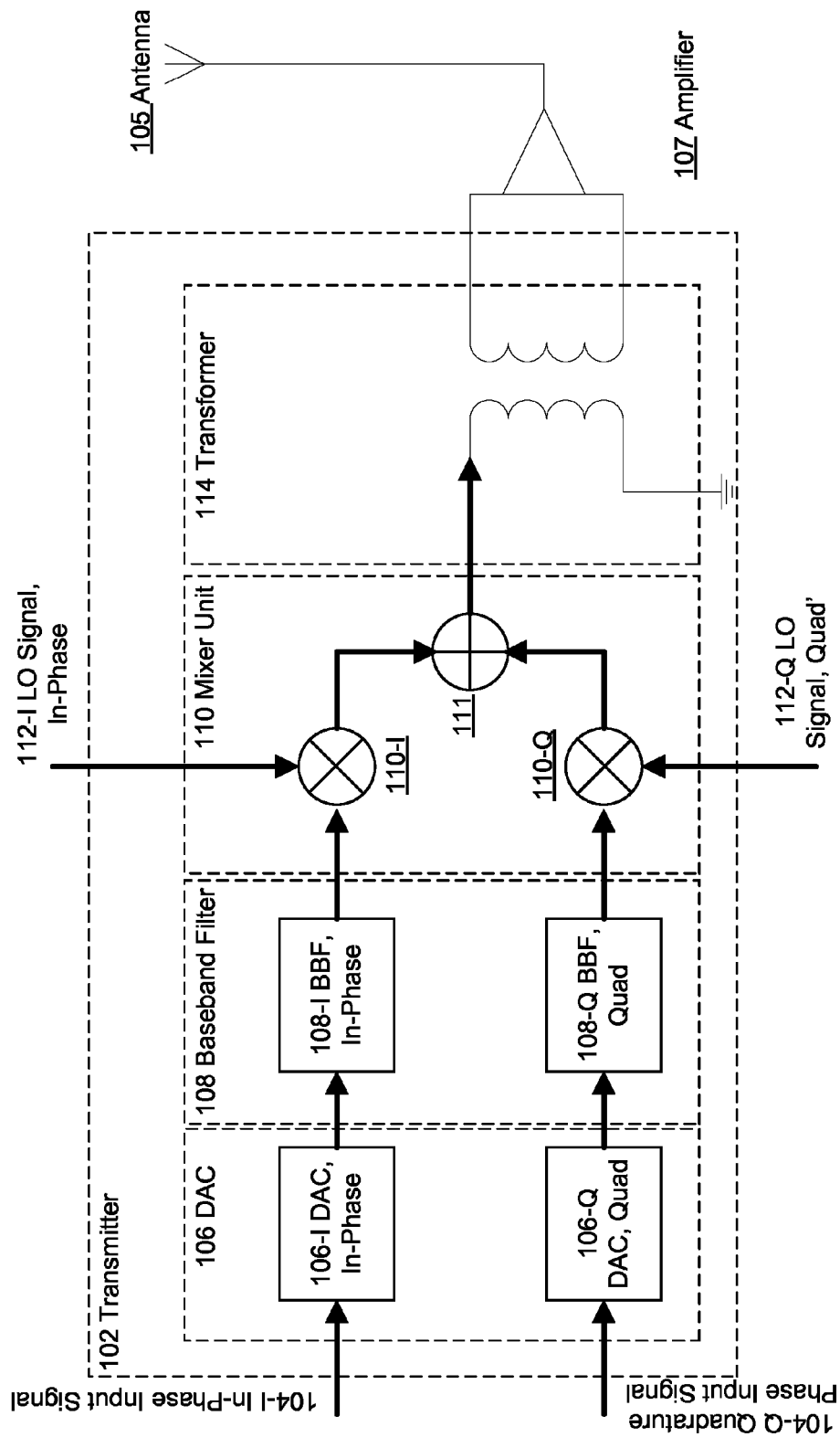
FIG. 1 is a block diagram of a system for controlling the gain of an electrical signal in accordance with the disclosed subject matter.

FIG. 1 is a block diagram of a system 100 in accordance with the disclosed subject matter for controlling the gain of an electrical signal. In one embodiment, the system 100 may include a transmitter 102, an amplifier 107 and an antenna 105. In one embodiment, the transmitter 102 may be configured to receive an input signal and produce an output signal. In one embodiment, the transmitter 102 may be included as part of or be an integrated circuit or a microchip. In one embodiment, the input signal may include an in-phase portion (In-phase input signal 104-I) and a quadrature phase portion (Quadrature-phase input signal 104-Q). In one embodiment, the amplifier 107 may be configured to produce an amplification of the output signal. In one embodiment, the antenna 105 may be configured to facilitate a transmission of the amplified output signal.

In one embodiment, the transmitter 102 may include a digital-to-analog converter (DAC) 106, a baseband filter (BBF) 108, a mixer unit 110, and a transformer 114. In one embodiment, the DAC 106 may be configured to convert a digital signal into an analog signal. In one embodiment, the DAC 106 may include an in-phase portion (DAC, In-phase 106-I) and a quadrature phase portion (DAC, Quadrature 106-Q) configured to receive the In-phase input signal 104-I and Quadrature-phase input signal 104-Q, respectively.

In one embodiment, the baseband filter (BBF) 108 may be configured to produce a baseband signal by filtering an input signal. In one embodiment, the baseband filter (BBF) 108 may be configured to produce, at least, four baseband signals utilizing an input signal. In one embodiment, the four baseband signals may include the following portions or phases: a positive in-phase, a negative in-phase, a positive quadrature phase, and a negative quadrature phase. In one embodiment, the BBF 108 may include an in-phase portion (BBF, In-phase 108-I) and a quadrature phase portion (BBF, Quadrature 108-Q) configured to receive the in-phase output of DAC 106-I or the quadrature output of the DAC 106-Q, respectively. In various embodiments without a DAC 106, the BBF 108 may receive the input signal (and any in-phase and quadrature components of the input signal) directly.

In one embodiment, the mixer unit 110 may be configured to produce an intermediate signal which is a sum of multiplications of portions of the baseband signal and portions of a local oscillator signal. In one embodiment, the local oscillator signal may include an in-phase portion (In-phase local oscillator signal 112-I) and a quadrature phase portion (Quadrature-phase local oscillator signal 112-Q). In one embodiment, the mixer unit 110 may include an in-phase multiplier 110-I configured to multiply an in-phase portion of the baseband signal and an in-phase local oscillator signal 112-I. In one embodiment, the mixer unit 110 may include a quadrature-phase multiplier 110-Q configured to multiply a quadrature-phase portion of the baseband signal and a quadrature-phase local oscillator signal 112-Q. It is understood that, in various embodiments, the multipliers may include more complex structures and that the illustrated multipliers are merely one illustrative non-limiting embodiment of the disclosed subject matter. In one embodiment, the mixer unit 110 may include a summer 111 configured to sum the results of the multipliers 110-I & 110-Q.

In one embodiment, the mixer unit 110 may include a number of switchable mixer unit cells configured to increase the gain experienced by an electronic signal by step increments, and wherein the step increments are substantially constant regardless of temperature inside the Radio-Frequency Integrated Circuit (RF-IC). In one embodiment, the switchable mixer unit cells may be switched on and off in order to increase or decrease the gain experienced by a signal. In one embodiment, the mixer unit 110 may include a number of switchable mixer unit cells some of which are configured to provide a full gain step, others of which may be configured to provide a partial gain step. Examples of such embodiments are described in more detail below in relation to FIGS. 2, 3, 4, and 5.

In one embodiment, each gain step, both full and partial, may be substantially constant regardless of temperature. For example, if each gain step equals 6 dB, to pick a non-limiting illustrative gain step value, the gain step may be substantially constant regardless of the temperature of the mixer unit 110. In a specific example, a user in Helsinki may be indoors where the temperature is 27 C. and experience a gain step of 6 dB. If that user goes outside where the temperature is −3 C., a gain step of substantially 6 dB should, in one embodiment, be experienced. It is understood that is merely one specific non-limiting illustrative example and that the disclosed subject matter is not limited to any particular location, temperature or gain step value.

In one embodiment, the transmitter 102 may include a transformer 114. In one embodiment, the transformer 114 may be configured to receive the output signal of the mixer unit cells, and transmit the output signal to an amplifier 107. In one embodiment, the intermediate signal may be provided by the mixer unit 110 and may include a number of portions. In one embodiment, the selection of the gain provided by the transformer 114 may be selected and changed dynamically.

Figure 2:
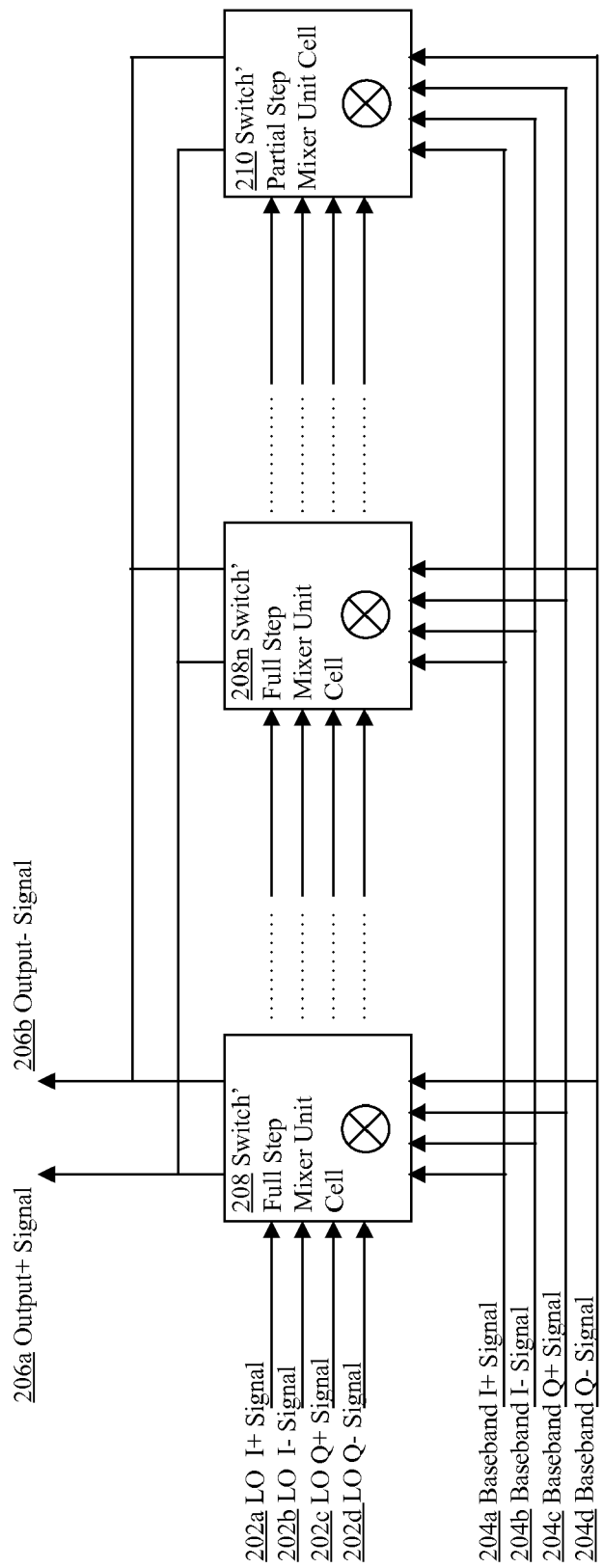
FIG. 2 is a block diagram of a system for controlling the gain of an electrical signal in accordance with the disclosed subject matter.

FIG. 2 is a block diagram of a system 200 for controlling the gain of an electrical signal in accordance with the disclosed subject matter. In one embodiment, the system may be or include a mixer unit 200 such as mixer unit 110 of FIG. 1. In one embodiment, the mixer unit 200 may include a number of switchable mixer unit cells configured to increase or decrease the gain experienced by an electronic signal by step increments, and wherein the step increments are substantially constant regardless of temperature. In one embodiment, the mixer unit may include a number of switchable mixer unit cells 208, 208n, & 210 some of which are configured to provide a full gain step (e.g., 208 & 208n), others of which may be configured to provide a partial gain step (e.g., 210).

In one embodiment, the mixer unit cells 208, 208n & 210 may receive a local oscillator signal 202 and a baseband signal 204. In one embodiment, the local oscillator signal 202 may include both positive and negative portions and in-phase and quadrature phase portions. In one embodiment, the local oscillator signal 202 may include a positive in-phase local oscillator signal 202a, a negative in-phase local oscillator signal 202b, a positive quadrature phase local oscillator signal 202c, and a negative quadrature phase local oscillator signal 202d. In one embodiment, the baseband signal 204 may include both positive and negative portions and in-phase and quadrature phase portions. In one embodiment, the baseband signal 204 may include a positive in-phase baseband signal 204a, a negative in-phase baseband signal 204b, a positive quadrature phase baseband signal 204c, and a negative quadrature phase baseband signal 204d.

In one embodiment, the mixer unit cells 208, 208n & 210 may combine the local oscillator signal 202 and a baseband signal 204 to produce an output signal 206. In one embodiment, the output signal 206 may include a positive output signal 206a and a negative output signal 206b. In one embodiment, the combination may include the multiplication of the, or portions of the, local oscillator signal 202 and a baseband signal 204 in the time domain. In one embodiment, the output of, or portions of the outputs of, each of the mixer unit cells 208, 208n & 210 may be combined to form the output signal 206, or portions of the output signal 206. In one embodiment, the combination of the outputs may include the addition of the outputs.

In one embodiment, the switchable full step mixer unit cells 208 & 208n may be configured such that when the switchable full step mixer unit cell is turned on, the gain experienced by an electronic signal is increased by a full step increment. In one illustrative example, a full gain step may be 6 dB; therefore, if a signal is already experiencing 6 dB of gain turning on or activating a switchable full step mixer unit cell 208 may increase the gain to 12 dB. FIG. 2 shows switchable full step mixer unit cells 208 & 208n, implying that, in one embodiment, the mixer unit 200 may include a plurality of switchable full step mixer unit cells (e.g., 208 and 208a through 208n in FIG. 2). In one embodiment, the mixer unit 200 may include $2^{10}$ (or 1,024) switchable full step mixer unit cells 208. In one embodiment, the mixer unit 200 may be allocated to provide a gain range of at least 60 dB. However, it is understood that the illustrative values are merely examples, and that the disclosed subject matter is not limited to this example.

In one embodiment, the switchable partial step mixer unit cells 210 may be configured such that when the switchable partial step mixer unit cell 210 is turned on, the gain experienced by an electronic signal is increased by a predetermined step increment less than that of a full step increment. In one illustrative example, a full gain step may be 6 dB and a partial gain step may be 2 dB; therefore, if a signal is already experiencing 6 dB of gain turning on or activating a switchable partial step mixer unit cell 210 may increase the gain to about 10.26 dB. In one embodiment, the mixer unit 200 may include a plurality of switchable partial step mixer unit cells 210. In one embodiment, the predetermined partial gain step provided by each partial step mixer unit cells 210 may be values, such as, for example, a half-full step (−6 dB), a quarter-full step (−12 dB), or an eighth-full step (−18 dB). However, it is understood that the illustrative values are merely examples, and that the disclosed subject matter is not limited to this example.

In one embodiment, a number of partial gain steps may substantially equal a full gain step. In such an embodiment, the mixer unit 200 may be configured to, as gain is increased, turn on or activate a number of switchable partial step mixer unit cells 210 until a full gain step is reached. In one embodiment, the triggering point may be the when one additional partial step would equal a full gain step and the mixer unit 200 receives an instruction to increase the gain by another partial gain step. At that point, in one embodiment, the mixer unit 200 may turn off the number of switchable partial step mixer unit cells 210 and turn on a switchable full step mixer unit cell 208 or 208n. Conversely, in one embodiment, the opposite may occur as the gain experienced by a signal is decreased. In one embodiment, this may allow greater granularity when controlling a gain to a signal.

In one embodiment, the pre-amplification driver (discussed above in the "Background" section) may be removed from a transmitter, for example transmitter 102 of FIG. 1. In one embodiment, the gain normally allocated to the pre-amplification driver may be distributed amongst the mixer unit 110 or 200 and the base-band filter 108.

In one embodiment, this may be accomplished by increasing the number of switchable full step mixer unit cells 208 & 208n. In one embodiment, if the gain range allocated to the now removed pre-amplification driver was 12 dB, the gain range allocated to the mixer unit 200 may be increased from 60 db to 72 dB. In embodiments where the full gain step is substantially equal to 6 dB, a 60 dB mixer unit 200 may include $2^{10}$ (or 1,024) switchable full step mixer unit cells 208. However, a 72 dB mixer unit 200 may include $2^{12}$ (or 4,096) switchable full step mixer unit cells 208. However, it is understood that these illustrative values are merely examples, and that the disclosed subject matter is not limited to this example.

In one embodiment, the allocation of gain range may be accomplished by increasing the full gain step value, as compared to embodiments including a pre-amplification driver. In one embodiment, the gain control granularity of the pre-amplification driver embodiment may be preserved or increased with the addition of at least one switchable partial step mixer unit cell. In one embodiment, if the gain range allocated to the now removed pre-amplification driver was 12 dB, the gain range allocated to the mixer unit 200 may be increased from 60 db to 72 dB. In embodiments where the mixer unit 200 may include $2^{10}$ (or 1,024) switchable full step mixer unit cells 208, the full gain step value may be increased from 6 dB to 7.2 dB thereby allowing a full gain range of 72 dB without the increase in the number of switchable full step mixer unit cells 208. In one embodiment, the mixer unit 200 may include a number of switchable partial step mixer unit cells 210.

In one embodiment, the each partial step may be substantially equal to a fraction of a full gain step, such that the sum of the available partial gain steps (plus one additional partial step, in some embodiments) may be substantially equal to a full gain step. In another embodiment, the partial gain step may be substantially equal to 6 dB. In such an embodiment, the mixer unit 200 may include combinations of switchable partial step mixer unit cells and switchable full step mixer unit cells 208 in non-integer ratio arrangements. In such an embodiment, the mixer unit 200 may include $2^{10}$ (or 1,024) switchable full step mixer unit cells 208 and four switchable partial step mixer unit cells 210: a half-full step (−6 dB), a quarter-full step (−12 dB), an eighth-full step (−18 dB) and a sixteenth-full step (−24 dB). In this embodiment, the mixer unit 200 may include a total of 1,028 mixer unit cells as opposed to the 4,096 mixer unit cells of the previously discussed embodiment. In one embodiment, the total number of mixer unit cells may equal that of the pre-amplification driver embodiment (e.g., $2^{10}$ or 1,024) but be allocated amongst switchable full step mixer unit cells 208 and switchable partial mixer unit cells 210. However, it is understood that the illustrative values are merely examples, and that the disclosed subject matter is not limited to this example.

In one embodiment, the amount of gain requested may be applied in a non-contiguous fashion. In such an embodiment, a number of switchable full gain step mixer unit cells and a number of switchable partial gain step mixer unit cells may be activated substantially simultaneously, allowing the intermediate gain values to be skipped. In one embodiment, the gain provided by each gain step, full and partial may be negative such that the signal is attenuated. In one embodiment, the mixer unit 110 may also turn off or deactivate the switchable mixer unit cells, both full and partial step as appropriate. In one embodiment, a user may be capable of both increasing and decreasing the gain applied or experienced by a signal.

Figure 3:
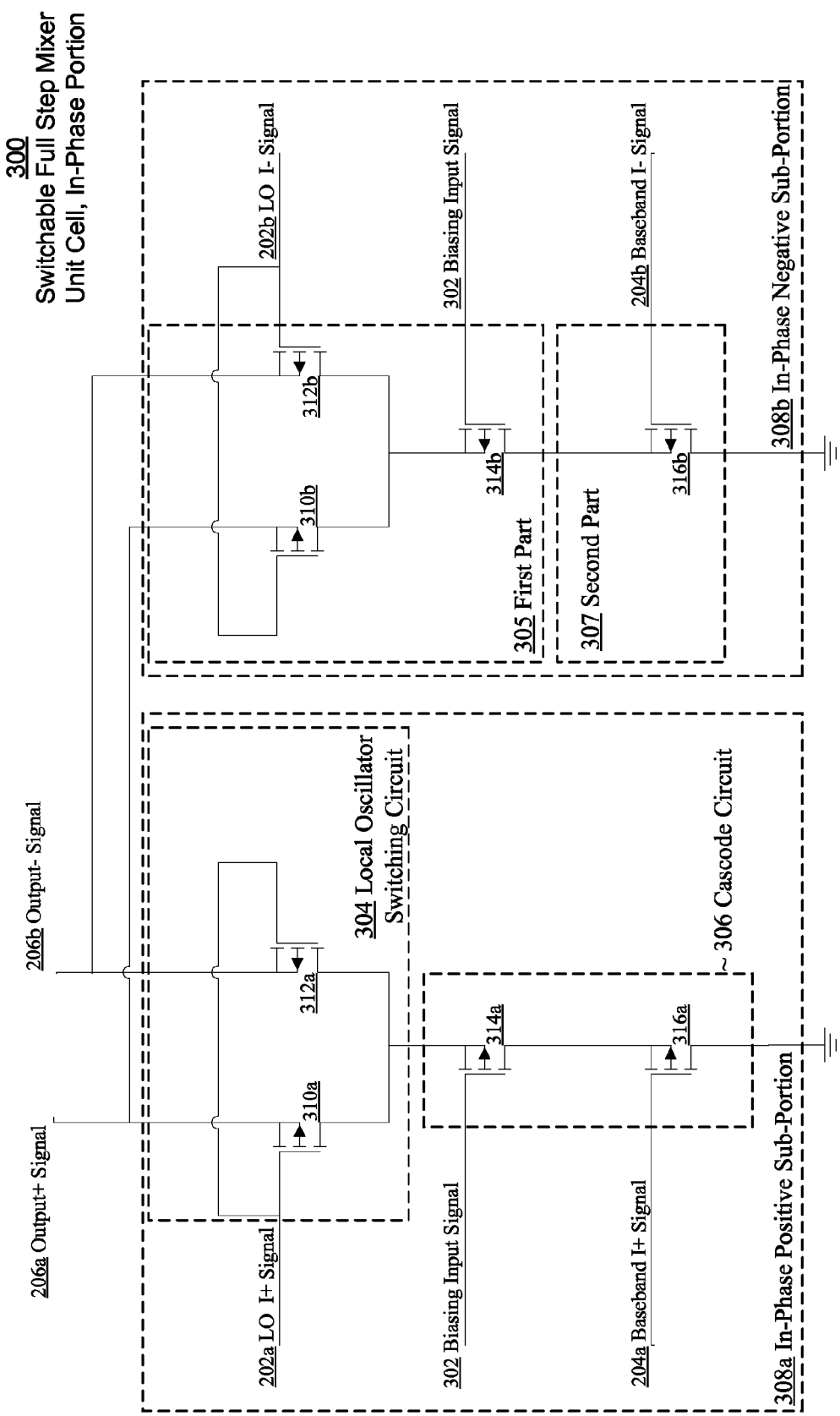
FIG. 3 is a schematic diagram of a system for controlling the gain of an electrical signal in accordance with the disclosed subject matter.

FIG. 3 is a schematic diagram of a system for controlling the gain of an electrical signal in accordance with the disclosed subject matter. In one embodiment, each switchable full step mixer unit cell 208 of FIG. 2 may include a mixer circuit. In one embodiment, each mixer circuit of the switchable full step mixer unit cell 208 of FIG. 2 may include an in-phase portion and a quadrature phase portion (not shown); and wherein each portion of the mixer circuit includes a positive sub-portion and a negative sub-portion. FIG. 3 illustrates the in-phase portion of a switchable full step mixer unit cell 300. In one embodiment, the in-phase portion 300 of a switchable full step mixer unit cell 208 may include an in-phase positive sub-portion 308a and a negative in-phase sub-portion 308b. In one embodiment, the quadrature-phase portion (not shown) of a switchable full step mixer unit cell 208 may be analogous to the in-phase portion 300 with the exception that the quadrature-phase portion may receive quadrature-phase signals, whereas the in-phase portion 300 may receive in-phase signals.

In one embodiment, the in-phase positive sub portion 308a may include a local oscillator switching circuit 304 and a cascode circuit 306. In one embodiment, each sub portion 308 may include a first part 305 having a local oscillator switching circuit 304 and a top of a cascode circuit 306 and a second part 307 having a bottom of a cascode circuit 306. It is understood that these groupings while shown on different sub-portions 308a & 308b of FIG. 3 occur in both sub-portions 308a & 308b and are merely separated so as to not obscure the drawing. It is also understood that the terms "top" and "bottom" are relative terms used to differentiate the elements of the cascode circuit 306 and in no way limit or dictate the physical orientation of the disclosed subject matter.

In one embodiment, the local oscillator switching circuit 304 may be configured to receive a local oscillator input signal 202. In one embodiment, the In-phase positive sub-portion 308a may receive positive in-phase local oscillator input signal 202a; whereas, the In-phase negative sub-portion 308b may receive negative in-phase local oscillator input signal 202b. And so on, for the quadrature-phase portion.

In one embodiment, the local oscillator switching circuit 304 may include a positive transistor 310a and a negative transistor 312a. In one embodiment, the gates of both the positive transistor 310a and negative transistor 312a may receive or be coupled with the positive in-phase local oscillator input signal 202a. In one embodiment, the sources of both the positive transistor 310a and negative transistor 312a may be coupled with each other and the cascode circuit 306. In one embodiment, the drain of the positive transistor 310a may provide a positive output signal 206a, and the drain of the negative transistor 312a providing a negative output signal 206a. It is understood that the configuration of the negative in-phase sub-portion 308b and the quadrature-phase portion may be analogous to the positive in-phase sub-portion 308a, described above.

In one embodiment, the cascode circuit 306 may include a top part and a bottom part. Although once again, it is understood that the terms "top" and "bottom" are relative terms used to differentiate the elements of the cascode circuit 306 and in no way limit or dictate the physical orientation of the disclosed subject matter. In one embodiment, the top of the cascode circuit 306 may include a biasing transistor 314a configured to receive a biasing input signal 302. In one embodiment, the gate of the biasing transistor 314a may be coupled with the biasing input signal 302. In one embodiment, drain of the biasing transistor 314a may be coupled with the local oscillator switching circuit 304. In one embodiment, the source of the biasing transistor 314a may be coupled with the bottom of the cascode circuit 306. It is understood that the configuration of the negative in-phase sub-portion 308b and the quadrature-phase portion may be analogous to the positive in-phase sub-portion 308a, described above.

In one embodiment, bottom of the cascode circuit 306 may be configured to receive a baseband input signal 204. In one embodiment, the second part 307 of each sub-portion of the switchable full step mixer unit cell 208 may include the bottom of the cascode circuit 306. In one embodiment, the bottom of the cascode circuit 306 may include a full step baseband transistor 316a. In one embodiment, the gate of the full step baseband transistor 316a may receive or be coupled with the positive in-phase baseband signal 204a. In one embodiment, the drain of the full step baseband transistor 316a may be coupled with the top of the cascode circuit 306. In one embodiment, the source of the full step baseband transistor 316a may be thought to be coupled with a ground. In one embodiment, the ground may be effective, relative, or absolute.

In one embodiment, the full step baseband transistor 316a may include a width, W. In one embodiment, the width of the full step baseband transistor 316a may affect the gain provided by the positive in-phase sub-portion 308a and may affect the amount of current allowed to flow through the full step baseband transistor 316a. In one embodiment, the width, W, of the full step baseband transistor 316a may affect the voltage at the interface between the top and bottom of the cascode circuit 306.

Figure 4:
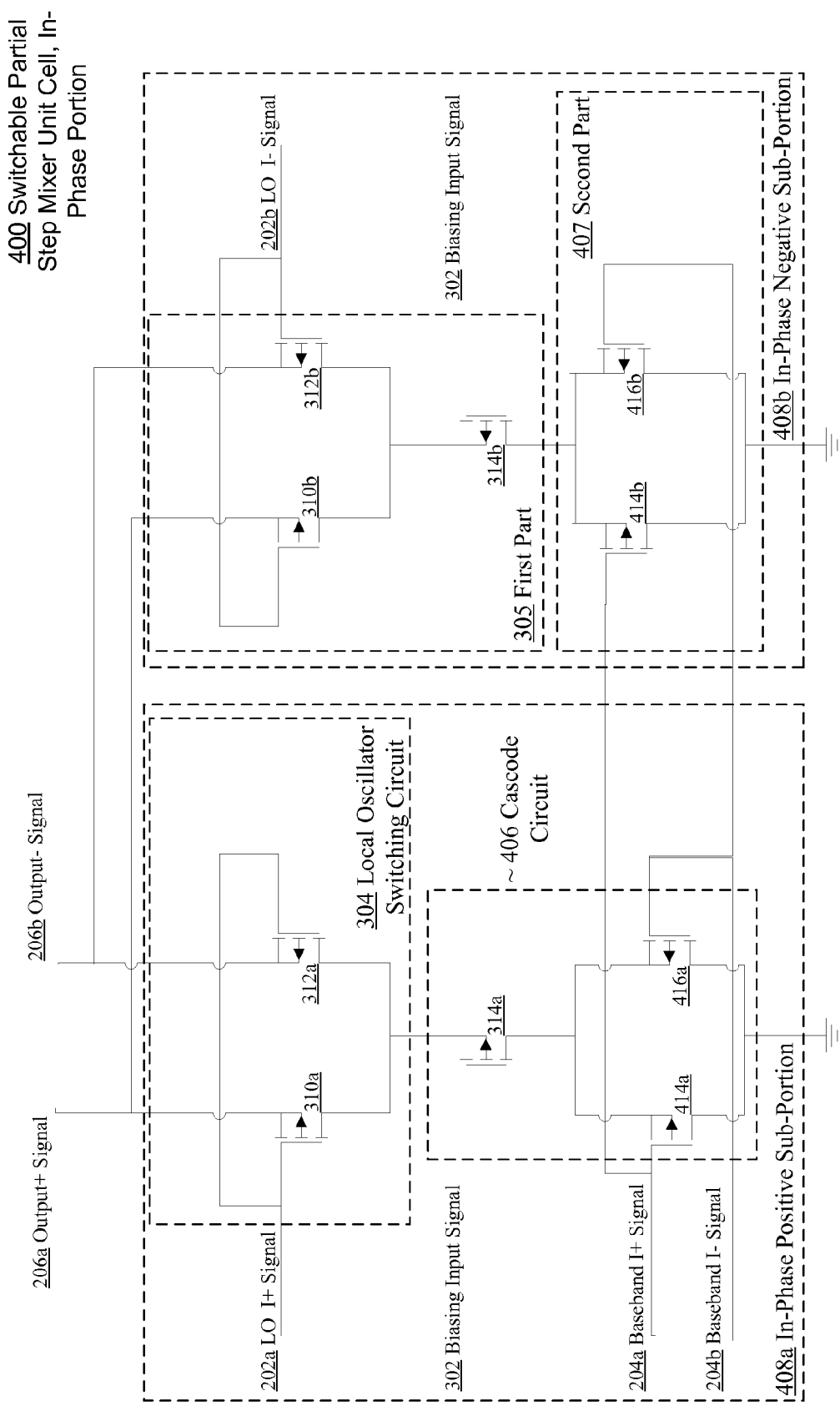
FIG. 4 is a schematic diagram of a system for controlling the gain of an electrical signal in accordance with the disclosed subject matter.

FIG. 4 is a schematic diagram of a system for controlling the gain of an electrical signal in accordance with the disclosed subject matter. As discussed above, in one embodiment, each switchable partial step mixer unit cell 210 of FIG. 2 may include a mixer circuit. In one embodiment, each mixer circuit of the switchable partial step mixer unit cell 210 of FIG. 2 may include an in-phase portion and a quadrature phase portion (not shown); and wherein each portion of the mixer circuit includes a positive sub-portion and a negative sub-portion. FIG. 4 illustrates the in-phase portion of a switchable partial step mixer unit cell 400. In one embodiment, the in-phase portion 400 of a switchable partial step mixer unit cell 210 may include an in-phase positive sub-portion 408a and a negative in-phase sub-portion 408b. In one embodiment, the quadrature-phase portion (not shown) of a switchable partial step mixer unit cell 210 may be analogous to the in-phase portion 400 with the exception that the quadrature-phase portion may receive quadrature-phase signals, whereas the in-phase portion 400 may receive in-phase signals.

In one embodiment, the in-phase positive sub portion 408a may include a local oscillator switching circuit 304 and a cascode circuit 406. In one embodiment, each sub portion 408 may include a first part 305 having a local oscillator switching circuit 304 and a top of a cascode circuit 406 and a second part 407 having a bottom of a cascode circuit 406. It is understood that these groupings while shown on different sub-portions 408a & 408b of FIG. 4 occur in both sub-portions 408a & 408b and are merely separated so as to not obscure the drawing. It is also understood that the terms "top" and "bottom" are relative terms used to differentiate the elements of the cascode circuit 406 and in no way limit or dictate the physical orientation of the disclosed subject matter.

In one embodiment, the local oscillator switching circuit 304 may be configured to receive a local oscillator input signal 202. In one embodiment, the In-phase positive sub-portion 408a may receive positive in-phase local oscillator input signal 202a; whereas, the In-phase negative sub-portion 408b may receive negative in-phase local oscillator input signal 202b. And so on, for the quadrature-phase portion. In one embodiment, the local oscillator switching circuit 304 of the switchable partial step mixer unit cell 210 may be substantially equivalent to the local oscillator switching circuit 304 of the switchable full step mixer unit cell 208.

In one embodiment, the local oscillator switching circuit 304 may include a positive transistor 310a and a negative transistor 312a. In one embodiment, the gates of both the positive transistor 310a and negative transistor 312a may receive or be coupled with the positive in-phase local oscillator input signal 202a. In one embodiment, the sources of both the positive transistor 310a and negative transistor 312a may be coupled with each other and the cascode circuit 406. In one embodiment, the drain of the positive transistor 310a may provide a positive output signal 206a, and the drain of the negative transistor 312a providing a negative output signal 206a. It is understood that the configuration of the negative in-phase sub-portion 408b and the quadrature-phase portion may be analogous to the positive in-phase sub-portion 408a, described above.

In one embodiment, the cascode circuit 406 may include a top part and a bottom part. Although once again, it is understood that the terms "top" and "bottom" are relative terms used to differentiate the elements of the cascode circuit 406 and in no way limit or dictate the physical orientation of the disclosed subject matter. In one embodiment, the top of the cascode circuit 406 may include a biasing transistor 314a configured to receive a biasing input signal 302. In one embodiment, the gate of the biasing transistor 314a may be coupled with the biasing input signal 302. In one embodiment, drain of the biasing transistor 314a may be coupled with the local oscillator switching circuit 304. In one embodiment, source of the biasing transistor 314a may be coupled with the bottom of the cascode circuit 406. It is understood that the configuration of the negative in-phase sub-portion 408b and the quadrature-phase portion may be analogous to the positive in-phase sub-portion 408a, described above. In one embodiment, the top of the cascode circuit 406 of the switchable partial step mixer unit cell 210 may be substantially equivalent to the top of the cascode circuit 406 of the switchable full step mixer unit cell 208. In one embodiment, the first part 305 of the switchable partial step mixer unit cell 210 may be substantially equivalent to the first part 305 of the switchable full step mixer unit cell 208.

In one embodiment, bottom of the cascode circuit 406 may be configured to receive both a positive baseband input signal 204a and a negative baseband input signal 204b. In one embodiment, the second part 407 of each sub-portion of the switchable partial step mixer unit cell 208 may include the bottom of the cascode circuit 406. In one embodiment, the bottom of the cascode circuit 406 may include a positive partial step baseband transistor 414a and a negative partial step baseband transistor 416a.

In one embodiment, the gate of the positive partial step baseband transistor 414a may receive or be coupled with the positive in-phase baseband signal 204a. In one embodiment, the gate of the negative partial step baseband transistor 416a may receive or be coupled with the positive in-phase baseband signal 204b. In one embodiment, the drain of the partial step baseband transistors 414a & 416a may be coupled with the top of the cascode circuit 406. In one embodiment, the source of the partial step baseband transistors 414a & 416a may be thought to be coupled with a ground, relative or absolute.

In one embodiment, the partial step baseband transistors 414a & 416a may each include a width, aW and bW respectively. In one embodiment, the widths may affect the effective resistance of the transistors. In one embodiment, these widths may affect the gain provided by the positive in-phase sub-portion 408a and may affect the amount of current allowed to flow through the partial step baseband transistors 414a & 416a. In one embodiment, the widths, aW and bW, of the partial step baseband transistors 414a & 416a may affect the voltage at the interface between the top and bottom of the cascode circuit 406.

In one embodiment, the widths, aW and bW, of the partial step baseband transistors 414a & 416a may be configured such that the sum of the widths is substantially equal to the width, W, of the full step baseband transistor 316a of FIG. 3 (e.g., 1=a+b). In such an embodiment, the voltage at the interface between the top and bottom of the cascode circuit 406 may be kept, during operation, substantially equal to the voltage at the interface between the top and bottom of the cascode circuit 306. In one embodiment, these voltages, or the substantially equivalent portions thereof, may be direct-current (DC) voltages. In one embodiment, the DC current through the cascode switch 406 and the local oscillator switching circuit 304 of the switchable partial step mixer unit cell 210 may be substantially equal to their corresponding elements of the switchable full step mixer unit cell 208. But, in one embodiment, the signal currents resulting from the switchable partial step mixer unit cell 210 may be scaled down compared to the signal currents of the switchable full step mixer unit cell 208. In one embodiment, the gain provided due, at least in part, to the second part 407 may be equal to an inverse power of 2 (e.g., $a-b=\frac{1}{2}^n$, where n=1, 2, 3, etc.).

In one embodiment, the negative sub-portions of the switchable partial mixer unit cell 210 (e.g., in-phase negative sub-portion 408b) may flip the relative widths of the partial step baseband transistors 414b & 416b, as compared to their positive counter-parts. For example, if in the positive sub-portion 408a the baseband transistor 414a has a width of aW and the baseband transistor 416a has a width of bW, then, in one embodiment, in the negative sub-portion 408b the baseband transistor 414b may have a width of bW and the baseband transistor 416b may have a width of aW. In one embodiment, this may allow the weighing of the gain of the positive and negative portions baseband signal 204 to occur in the respective sub-portions of the switchable partial mixer unit cell 210. In one embodiment, with such a structure, the gain step when switching from partial mixer unit cell to a full mixer unit cell may remain constant over temperature.

FIG. 5 is a flowchart of a technique 500 for controlling the gain of an electrical signal in accordance with the disclosed subject matter. Block 502 illustrates that, in one embodiment, a request to amplify an electrical signal may be received. In one embodiment, the electrical signal may be utilized as part of a Wideband Code Division Multiple Access (WCDMA) protocol. In one embodiment, the mixer unit 110 of FIG. 1 may receive this request, as described above.

Block 504 illustrates that, in one embodiment, a switchable partial step mixer unit cell may be activated or turned on in order to amplify the electrical signal by a predetermined step increment, wherein the predetermined step increment is less that that of a full step. In one embodiment, the predetermined step increment may be referred to as a partial gain step. In one embodiment, the mixer unit 110 of FIG. 1 may turn on the switchable partial step mixer unit cell 210 of FIG. 2, as described above.

Block 506 illustrates that, in one embodiment, an additional request to amplify an electrical signal may be received. In one embodiment, the mixer unit 110 of FIG. 1 may receive this request, as described above.

Block 508 illustrates that, in one embodiment, a determination may be made as to whether or not the requested additional amplification will result in a total gain reachable using full gain steps. In one embodiment, a plurality of partial gain steps may be substantially equivalent to a, or an integer number of, full gain steps, as described above. In one embodiment, the mixer unit 110 of FIG. 1 may make this determination, as described above.

Block 510 illustrates that, in one embodiment, if the additional gain will not result in a total gain reachable using full gain steps, an additional switchable partial step mixer unit cell may be activated or turned on. In one embodiment, the mixer unit 110 of FIG. 1 may turn on the switchable partial step mixer unit cell 210 of FIG. 2 or equivalent element, as described above.

Block 512 illustrates that, in one embodiment, if the additional gain will result in a total gain reachable using full gain steps, the active switchable partial step mixer unit cell(s) may be deactivated or turned off, and a switchable full step mixer unit cell. In one embodiment, the mixer unit 110 of FIG. 1 may turn off the switchable partial step mixer unit cell 210 of FIG. 2 and turn on the switchable full step mixer unit cell 208 of FIG. 2, as described above.

In one embodiment, the technique 500 may include the ability to decrease the amount of amplification. In such an embodiment, the Blocks analogous but opposite in result to Blocks 506, 508, 510, & 512 may be included. In one embodiment, the technique 500 may include the ability to adjust the gain, positive or negative, applied to a signal in a non-continuous fashion. In such an embodiment, a number of switchable full gain step mixer unit cells and a number of switchable partial gain step mixer unit cells may be activated substantially simultaneously, allowing the intermediate gain values to be skipped.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A method comprising:
   requesting amplification of an electrical signal;
   turning on a partial step mixer unit cell to amplify the electrical signal by a partial predetermined step increment less than that of a full step;
   requesting additional amplification of the electrical signal;
   turning on one or more additional partial step mixer unit cells to amplify the electrical signal, until the full gain step has been reached;
   once the sum of the partial steps is equal to the full step, turning off the partial step mixer unit cells and turning on a full step mixer unit cell.

2. The method of claim 1 wherein turning on a partial step mixer unit cell includes multiplying a baseband filtered signal with a local oscillator signal.

3. The method of claim 2 wherein turning on a partial step mixer unit cell includes utilizing a circuit including:
   a local oscillator switching circuit and
   a cascode circuit,
   the cascode circuit having a top half coupled between the local oscillator switching circuit and the bottom half of the cascode circuit,
      wherein the bottom half of the cascode circuit includes two bottom transistors configured in parallel;
      wherein the sum of the widths of the two bottom transistors of the cascade circuit is substantially equal of the width of a bottom cascode transistor included as part of the full step mixer unit cell.

4. An apparatus comprising:
   at least one switchable full step mixer unit cell,
      wherein the switchable full step mixer unit cell is configured to, when the full step mixer unit cell is turned on, adjust the gain experienced by at least one electronic signal by a full step increment; and
   at least one switchable partial step mixer unit cell configured to, when the partial step mixer unit is switched on, adjust the gain experienced by the electronic signal by a predetermined step increment less than that of a full step increment.

5. The apparatus of claim 1 wherein each of the switchable full step mixer unit cells includes a mixer circuit;
   wherein each of the at least one switchable partial step mixer unit cells includes a mixer circuit; and
   wherein each of the mixer circuit includes at least two sub-portions.

6. The apparatus of claim 5 wherein each sub-portion of each mixer circuit includes:
   a first part having a local oscillator switching circuit and a top of a cascode circuit, and
   a second part having a bottom of a cascode circuit.

7. The apparatus of claim 6 wherein the first part of the mixer circuits of each of the switchable full step mixer unit cells and the at least one switchable partial step mixer unit cells are substantially identical.

8. The apparatus of claim 6 wherein the local oscillator switching circuit is configured to receive a local oscillator input signal, and
   the top of the cascode circuit is configured to receive a biasing input signal.

9. The apparatus of claim 8 wherein the local oscillator switching circuit includes a positive transistor and a negative transistor, each transistor having a gate, a source, and a drain; and
   wherein:
      the gate of each transistor is coupled with the local oscillator input signal,
      the sources of the transistors are both coupled with each other and the cascode circuit,
      the drain of the positive transistor is configured to provide a positive output signal, and
      the drain of the negative transistor is configured to provide a negative output signal.

10. The apparatus of claim 6 wherein the second part of each sub-portion of each of the switchable full step mixer unit cells is configured to receive a baseband input signal; and
    wherein
       the second part of the positive sub-portions is configured to receive a positive baseband input signal, and
       the second part of the negative sub-portions is configured to receive a negative baseband input signal.

11. The apparatus of claim 10 wherein the second part of each sub-portion of each of the at least one switchable partial step mixer unit cells is configured to receive both a positive baseband input signal and a negative baseband input signal.

12. The apparatus of claim 11 wherein the second part of each sub-portion of each of the switchable full step mixer unit cells includes a full step baseband transistor, having a gate, a drain and a width; and
    wherein:
       the gate of the full step baseband transistor is coupled with the baseband input signal, and
       the drain is coupled with the top of the cascode circuit.

13. The apparatus of claim 12 wherein the second part of each sub-portion of each of the at least one switchable partial step mixer unit cells includes
    a positive partial step baseband transistor having a gate, a drain and a width,
       wherein:
          the gate of the positive partial step baseband transistor is coupled with a positive baseband input signal, and the drain of the positive partial step baseband transistor is coupled with the top of the cascode circuit, and a negative partial step baseband transistor having a gate, a drain and a width,
wherein:
the gate of the negative partial step baseband transistor is coupled with a negative baseband input signal, and
the drain of the negative partial step baseband transistor is coupled with the top of the cascode circuit.

14. The apparatus of claim 13 wherein the sum of the widths of the positive partial step baseband transistor and the negative partial step baseband transistor is substantially equal to the width of the full step baseband transistor.

15. A system comprising:
a baseband filter configured to produce baseband signals; and
a mixer unit configured to produce an output signal based upon the baseband signals; and
the mixer unit comprising:
at least one full step mixer unit cell, wherein the full step mixer unit cell is configured to adjust the gain experienced by the baseband signals by a full step increment,
at least one partial step mixer unit cell configured to adjust the gain experienced by the baseband signals by a predetermined step increment less than that of a full step increment.

16. The system of claim 15 wherein the mixer unit includes at least $2^{10}$ full step mixer unit cells.

17. The system of claim 15 the system further including the amplifier and an antenna configured to transmit the output signal.

18. The system of claim 15 wherein the baseband filter is configured to utilize a Wideband Code Division Multiple Access (WCDMA) protocol.

19. The system of claim 15 wherein the mixer unit provides a maximum gain of between 60 dB and 72 dB, inclusive.

20. The system of claim 19 wherein the full step increment gain of each of the full step mixer unit cells is substantially between 5 dB and 8 dB, inclusive; and
the partial step increment gain of each of the partial step mixer unit cells is substantially between one-eighth and one-half, inclusive, of the full step increment gain.

* * * * *

UNITED STATES PATENT AND TRADEMARK OFFICE
CERTIFICATE OF CORRECTION

| | |
|---|---|
| PATENT NO. | : 8,275,332 B2 |
| APPLICATION NO. | : 13/303066 |
| DATED | : September 25, 2012 |
| INVENTOR(S) | : Ahmad Mirzaei et al. |

It is certified that error appears in the above-identified patent and that said Letters Patent is hereby corrected as shown below:

In column 12, line 6, in claim 5, delete "claim 1" and insert -- claim 4 --, therefor.

Signed and Sealed this
Fourth Day of December, 2012

David J. Kappos
*Director of the United States Patent and Trademark Office*